United States Patent
Peschke et al.

(10) Patent No.: US 10,031,537 B2
(45) Date of Patent: Jul. 24, 2018

(54) DIFFERENTIAL PROBE WITH COMMON-MODE OFFSET

(71) Applicant: Rohde & Schwarz GmbH & Co. KG, Munich (DE)

(72) Inventors: Martin Peschke, Munich (DE); Roland Krimmer, Germering (DE); Alexander Kunze, Munich (DE); Andreas Ziegler, Pegnitz (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 598 days.

(21) Appl. No.: 14/084,751

(22) Filed: Nov. 20, 2013

(65) Prior Publication Data

US 2014/0139205 A1     May 22, 2014

(30) Foreign Application Priority Data

Nov. 20, 2012   (DE) ........................ 10 2012 221 132

(51) Int. Cl.

| | |
|---|---|
| *G01R 1/20* | (2006.01) |
| *G01R 1/30* | (2006.01) |
| *G01R 19/00* | (2006.01) |
| *G05F 1/10* | (2006.01) |
| *G05F 1/46* | (2006.01) |
| *G01R 1/067* | (2006.01) |

(52) U.S. Cl.
CPC ......... *G05F 1/461* (2013.01); *G01R 1/06772* (2013.01); *G01R 1/20* (2013.01); *G01R 1/30* (2013.01); *G01R 19/0023* (2013.01); *G05F 1/10* (2013.01); *G01R 1/06766* (2013.01); *G01R 1/06788* (2013.01)

(58) Field of Classification Search
CPC ........ G01R 1/20; G01R 1/30; G01R 19/0023; G05F 1/10; G05F 1/46; G05F 1/461; H03F 2200/375
See application file for complete search history.

(56) References Cited

U.S. PATENT DOCUMENTS

| | | | |
|---|---|---|---|
| 2005/0114047 A1 | 5/2005 | McTigue | |
| 2006/0176030 A1* | 8/2006 | Van Epps | .......... G01R 1/06766 323/234 |
| 2006/0176074 A1* | 8/2006 | Van Epps | .......... G01R 1/06766 326/30 |
| 2013/0207643 A1 | 8/2013 | Peschke et al. | |

* cited by examiner

*Primary Examiner* — Kristal Feggins
*Assistant Examiner* — Kendrick Liu
(74) *Attorney, Agent, or Firm* — Carter, DeLuca, Farrell & Schmidt, LLP

(57) ABSTRACT

A differential probe provides a probe input which comprises two inputs for recording a first and second input signal. The differential probe further provides a first amplifier which is connected to the two inputs. The differential probe additionally provides a compensation device, which generates and superposes on the first and second input signal a differential offset signal. The compensation device also generates a common-mode offset signal which is independent of the differential offset signal.

11 Claims, 3 Drawing Sheets

US 10,031,537 B2

DIFFERENTIAL PROBE WITH COMMON-MODE OFFSET

FIELD OF THE INVENTION

The invention relates to a differential probe of which the differential voltage range and the common-mode voltage window can be matched arbitrarily to the input signal to be measured.

With differential probes, the problem frequently occurs that, dependent upon the arrangement of the differential probe in the circuit to be measured, a noise pulse cannot be registered. This is attributable, for example, to the fact that the voltage range of the differential probe is exceeded, and the latter is overdriven. At one end, this can occur because its differential voltage range or its common-mode voltage window has been exceeded.

BACKGROUND

From US 2005/0114047 A1, a probe is known which can be used for differential and single-ended applications. For this purpose, two input signals are supplied to an amplifier. Two switchable offset sources are available, whereas a first offset voltage is added to the first input signal via a first summing unit, and whereas a second offset voltage is added to the second input signal via a second summing unit. Via the first offset source and the second offset source, a differential offset can be varied. The disadvantage with US 2005/0114047 A1 is that it is not ensured that the common-mode voltage window cannot be exceeded by the first and second input signal.

Accordingly, an object of the invention presented here is to provide a differential probe, of which the differential voltage range and the common-mode voltage window is not exceeded during a measurement, so that the noise signals to be measured can be registered securely.

BRIEF SUMMARY

The differential probe according to the invention provides a probe input which comprises two inputs for recording a first and second input signal, whereas the differential probe provides a first amplifier which is connected to the two inputs. Furthermore, the differential probe provides a compensation device, whereas the compensation device generates and superposes on the first and second input signal a differential offset signal. Furthermore, the compensation device also generates a common-mode offset signal which is independent of the differential offset signal. In this context, it is advantageous that a common-mode offset signal is generated, so that it is ensured that, within the measurement operation, the common-mode voltage window of the differential probe according to the invention is not overdriven. This ensures that all noise signals can be displayed. Furthermore, it is particularly advantageous that the common-mode offset signal is independent of the differential offset signal. This means that tolerances within the accuracy for the setting of the differential offset signal do not influence the accuracy of the common-mode offset signal.

Furthermore, a further advantage is achieved if the common-mode offset signal and/or the differential offset signal is supplied to the first and second input signal at the input of the differential probe and/or if the common-mode offset signal and/or the differential offset signal is supplied to the first and second input signal at the low end in each case of a corresponding voltage splitter within the differential probe and/or if the common-mode offset signal and/or the differential offset signal is supplied to the first and second input signal at the input of the first amplifier of the differential probe and/or if the differential offset signal is supplied to the first and second input signal in one of several stages of the amplifier of the differential probe. This means, by contrast with a superposition at the output of the first amplifier, that the first amplifier, indeed, need not provide a very high dynamic range.

Furthermore, an advantage is achieved if a first voltage source within the compensation device comprises a first digital/analog converter, whereas the first digital/analog converter is connected to a differential amplifier, and/or if the differential amplifier is connected to the first and second amplifier input of the first amplifier. In this manner, a differential offset signal can be generated very simply. This differential offset signal is very simply superposed by the two outputs of the differential amplifier on the first and second input signal at the first and second amplifier input of the first amplifier.

Furthermore, an advantage is achieved if the compensation device provides a second voltage source, and if the second voltage source comprises a second digital/analog converter, and if the second digital/analog converter is connected to a common-mode terminal of the differential amplifier. In this context, it is particularly advantageous that the second digital/analog converter is independent of the first digital/analog converter, so that a common-mode offset signal which is independent of the differential offset signal can be generated as a result.

Furthermore, an advantage is achieved if the differential amplifier further provides a correction unit which compensates a drift of the common-mode offset signal. This means that the common-mode offset signal can also always be accurately adjusted even with increasing aging of the differential probe or different operating temperatures of the differential probe according to the invention.

An advantage is also achieved with the differential probe according to the invention if the differential probe provides a measuring prod, whereas the measuring prod is embodied to contact a first and second input signal, whereas, in this context, the first amplifier and the compensation device are integrated in the measuring prod. Accordingly, it is particularly advantageous that as few noise signals as possible can couple into the first and second input signal.

BRIEF DESCRIPTION OF THE DRAWINGS

Various exemplary embodiments of the invention are described by way of example below with reference to the drawings. Identical subject matters provide the same reference numbers. The corresponding figures of the drawings show in detail.

DETAILED DESCRIPTION

Figure 1:
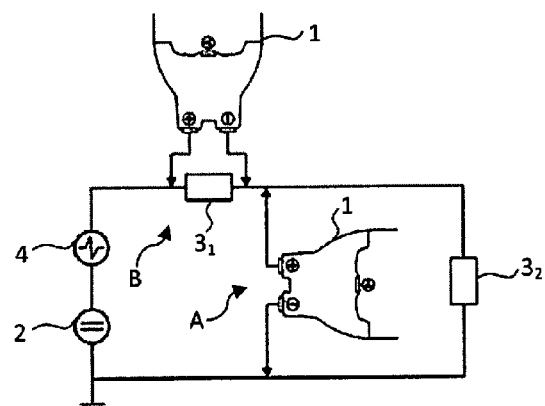
FIG. 1 an exemplary test scenario for the differential probe.

FIG. 1 shows an exemplary test scenario for a differential probe 1. A simple circuit with a constant voltage source 2 which is connected via a series circuit of one resistor $3_1$ and one resistor $3_2$ to the reference ground is illustrated. The resistor $3_1$ can be a shunt resistor. A noise value 4 which superposes the direct voltage signal of the constant voltage source 2 is also evident.

In FIG. 1, it is clearly evident that, in the case of a differential probe 1, there are two independent input voltages. At one end, there is the differential input voltage $V_{dm}$. This is the voltage between positive (+) and negative (−) signal input. This voltage is generally to be measured with the assistance of the differential probe 1. At the other end, there is also the common-mode input voltage $V_{cm}$. This relates to the mean voltage of the two signal inputs relative to the reference ground. This voltage is generally not measured. However, because both of these independent input voltages are present, it follows directly that the voltage range of the differential probe 1 is also specified by two independent limits.

A first limit exists in the differential voltage range $V_{dnmax}$. The second limit is determined by the common-mode voltage window $V_{cnmax}$. As soon as one or both of these limits, respectively voltage ranges, is exceeded, the differential probe 1 is overdriven. In the test scenario from FIG. 1, an attempt is made to measure a noise pulse, which is present on an 8 V supply voltage. For example, the resistor $3_1$ provides a value of 1Ω. In this context, the probe used for the measurement has an exemplary differential voltage range $V_{dnmax}$ of ±2 V and a common-mode voltage window $V_{dnmax}$ of ±5 V.

In a first test scenario A, the differential probe 1 measures a voltage downstream of the first resistor $3_1$ relative to the reference ground. In this context, the common-mode voltage window of the probe is exceeded ($V_{cn}$=8 V).

In a second test scenario B, the differential probe 1 measures the voltage decline across the first resistor $3_1$. In this context, the differential voltage range of the probe is exceeded ($V_{dn}$=8 V).

Figure 2A:
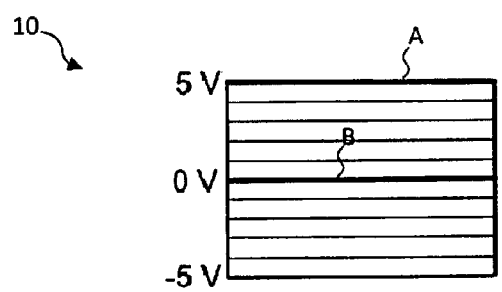
FIG. 2A a display for an exceeded differential voltage range and for an exceeded common-mode voltage window.

FIG. 2A shows a display for an exceeded differential voltage range and for an exceeded common-mode voltage window. For the case that the differential probe 1 is connected corresponding to the measurement A, the differential voltage range of the differential probe 1 is exceeded. On the display device 10, and overdriven curve can be seen at the upper edge of the display region. The overdriven curve also provides the reference marking A.

For the case that the differential probe 1 is connected corresponding to the test setup B, the common-mode voltage window of the differential probe 1 is exceeded. On the display device 10, this overdrive is not obvious, however, the pulse 21 to be measured cannot be seen because of the overdrive.

In order to prevent an overdrive as shown in test setup A, the probe according to the invention offers the possibility of feeding in a differential offset signal. In this context, the differential voltage range is shifted by the set value of the differential offset signal. The differential offset signal can conventionally be selected within the value range which is equally large or larger than the differential voltage range.

Figure 2B:
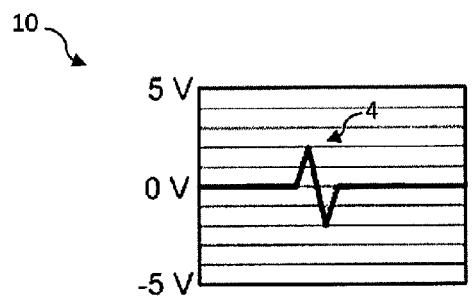
FIG. 2B a noise pulse to be measured in the case of a correct setting of a differential offset signal and a correct setting of a common-mode offset signal.

The differential offset signal can relate, at one end, to a differential offset voltage or, at the other end, to a differential offset current. For example, the differential offset signal can be set within a value range of, for example, ±20 V. For the case that, for example, a differential offset signal of $V_{dm, off}$=+8 V is selected, the correct image of the noise pulse 21 to be measured is obtained in the display device 10, as is evident from FIG. 2B. Accordingly, FIG. 2B shows the noise pulse 21 to be measured in the case of a correct setting of a differential offset signal and a correct setting of common-mode offset signal.

Figure 3:
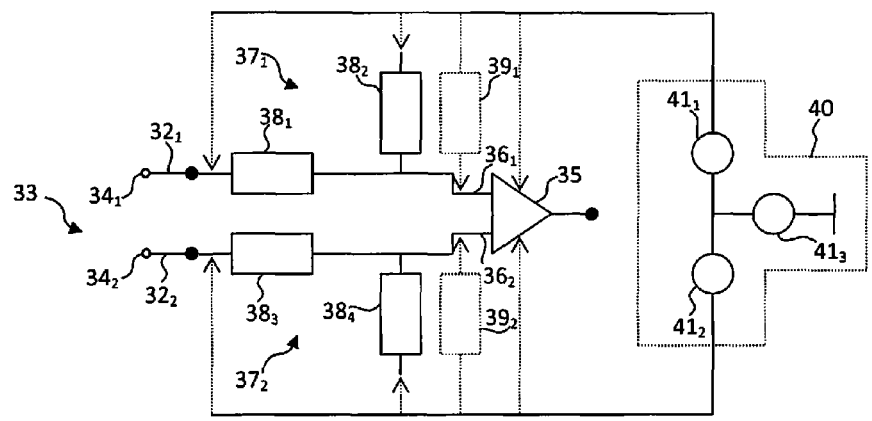
FIG. 3 an exemplary embodiment of the differential probe which describes at which positions within the differential probe a differential offset signal and a common-mode offset signal can be superposed on a first and a second input signal.

FIG. 3 shows an exemplary embodiment of the differential probe 1 according to the invention, which describes at which positions within the differential probe 1 a differential offset signal and a common-mode offset signal can be superposed on a first and second input signal $32_1$, $32_2$. For this purpose, the differential probe 1 according to the invention provides a probe input 33, which comprises two inputs $34_1$, $34_2$ for recording a first and a second input signal $32_1$, $32_2$. In this context, the first input signal $32_1$ is supplied to the differential probe 1 according to the invention via the first input $34_1$. The second input signal $32_2$ is supplied to the differential probe 1 via the second input $34_2$. Both input signals $32_1$, $32_2$ are preferably high-frequency signals.

Furthermore, the differential probe 1 provides a first amplifier 35, which is electrically connected to the first input $34_1$ and to the second input $34_2$. The first amplifier 35 provides a first amplifier input $36_1$ and a second amplifier input $36_2$. The first amplifier input $36_1$ in this context is directly or indirectly connected to the first input $34_1$. Accordingly, the second amplifier input $36_2$ is also directly or indirectly connected to the second input $34_2$. Between the first amplifier input $36_1$ and the first input $34_1$, a first resistive voltage splitter $37_1$ can be further connected. Between the second amplifier input $36_2$ and the second input $34_2$, a second resistive voltage splitter $37_2$ can also be further connected. The first resistive voltage splitter $37_1$ comprises a first and second resistor $38_1$, $38_2$. The first resistor $38_1$ of the first resistive voltage splitter $37_1$ is connected, at one end, to the first input $34_1$ and, at the other end, to the first amplifier input $36_1$. The second resistor $38_2$ is connected, at one end, to the first amplifier input $36_1$ and, at the other end, preferably to the reference ground.

The second resistive voltage splitter $37_2$ also comprises a third and fourth resistor $38_3$, $38_4$. The third resistor $38_3$ is, at one end, connected to the input $34_2$ and, at the other end, to the second amplifier input $36_2$. The fourth resistor $38_4$ is connected, at one end, to the second amplifier input $36_2$ and, at the other end, to the reference ground.

Furthermore, the differential probe 1 further provides a compensation device 40, whereas the compensation device 40 generates the differential offset signal and the common-mode offset signal. It should be emphasised that the differential offset signal is independent of the common-mode offset signal. This means that inaccuracies in the generation of the differential offset signal do not influence the accuracy of the generation of the common-mode offset signal.

Furthermore, the compensation device 40 superposes the differential offset signal on the first and second input signal $32_1$, $32_2$. The compensation device 40 also superposes the common-mode offset signal on the first and the second input signal $32_1$, $32_2$. The common-mode offset signal can relate to a common-mode offset voltage or a common-mode offset current.

By way of example, the compensation device 40 in FIG. 3 comprises three voltage respectively current sources $41_1$, $41_2$, $41_3$. The display by means of three voltage or current sources $41_1$, $41_2$, $41_3$ is simplified and is intended only to facilitate understanding. In fact, as will be explained later in detail, only two voltage or current sources are required. In the example from FIG. 3, the voltage or current source $41_1$ generates the differential offset signal, which is superposed on the first input signal $32_1$. The voltage or current source $41_2$ generates the differential offset signal, which is superposed on the second input signal $32_2$. The voltage or current source $41_3$ accordingly generates the common-mode offset signal and superposes this on the first input signal $32_1$ and the second input signal $32_2$.

Furthermore, different points are illustrated in FIG. 3, at which the differential offset signal and the common-mode offset signal can be superposed on the first input signal $32_1$ and the second input signal $32_2$. It is clearly evident that the common-mode offset signal and/or the differential offset signal are supplied to the first and second input signal $32_1$, $32_2$ at the first input $34_1$ and the second input $34_2$.

It is also possible that the common-mode offset signal and/or the differential offset signal is supplied to the first and second input signal $32_1$, $32_2$ at the low end in each case of a corresponding voltage splitter $37_1$, $37_2$ within the differential probe 1. As already explained, the voltage splitter $37_1$, $37_2$ relates to a resistive voltage splitter $37_1$, $37_2$. The low end of the first resistive voltage splitter $37_1$ is understood to be the connecting point of the second resistor $38_2$ which faces away from the first amplifier input $36_1$. The same also applies for the second resistive voltage splitter $37_2$. The low end in this case corresponds to the connecting point of the fourth resistor $38_4$ which faces away from the second amplifier input $36_2$. In this case, the resistors $38_2$ and $38_4$ are no longer connected to the reference ground.

Alternatively, the common mode offset signal and/or the differential offset signal can be supplied to the first and second input signal $32_1$, $32_2$ at the first and second amplifier input $36_1$, $36_2$ of the first amplifier 35 of the differential probe 1. Such a supply is illustrated via the resistors $39_1$, $39_2$ shown in dotted lines.

Furthermore, the common-mode offset signal and/or the differential offset signal could be supplied to the first and second input signal $32_1$, $32_2$ in one of several stages of the first amplifier 35 of the differential probe 1. This is indicated by the dotted lines in FIG. 3, which point towards the amplifier with an arrow. A compensation through the differential offset signal and the common-mode offset signal, which are only connected at the output of the amplifier 35, does not occur because this would have the disadvantage that the amplifier 35 would have to provide a very high dynamic range.

Figure 4:
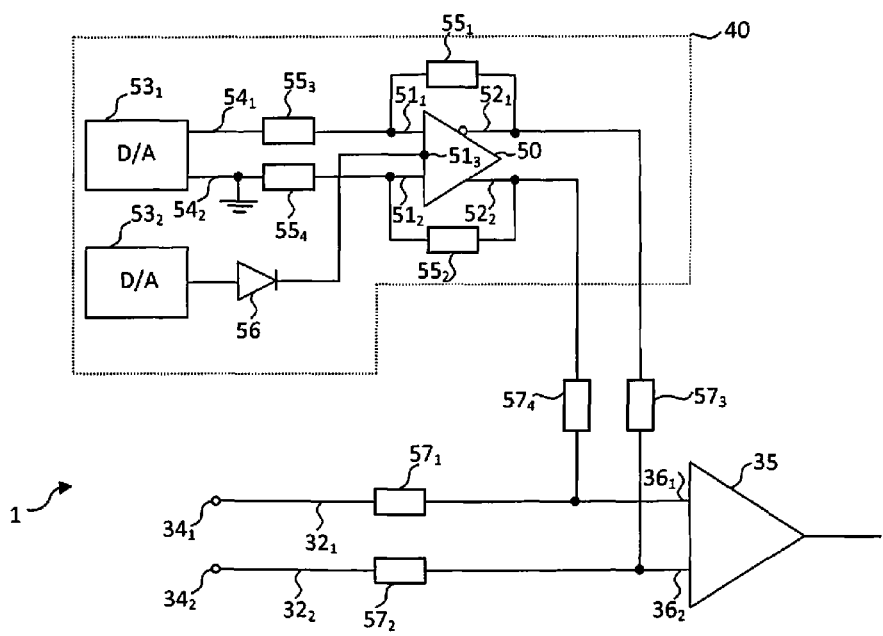
FIG. 4 an exemplary embodiment which shows the construction of the differential probe according to the invention.

FIG. 4 shows an exemplary embodiment which shows the construction of the differential probe 1 according to the invention. It is clearly evident that the first amplifier 35 provides a first amplifier input $36_1$, and that the first amplifier input $36_1$ is connected to the first input $34_1$ of the differential probe 1. The first amplifier 35 further provides a second amplifier input $36_2$, whereas the second amplifier input $36_2$ is connected to the second input $34_2$ of the differential probe 1. The compensation device 40 is further connected to the first amplifier 35 at its first amplifier input $36_1$ and/or at its second amplifier input $36_2$. As already explained in FIG. 3, the compensation device 40 can also be connected at other, different positions upstream of the first amplifier 35 or in the first amplifier 35. However, the compensation device 40 cannot be connected to the output of the first amplifier 35.

It is clearly evident that the compensation device 40 provides a differential amplifier 50, whereas the differential amplifier 50 provides a first input $51_1$, a second input $51_2$, a first output $52_1$ and a second output $52_2$. As already described in FIG. 3, the voltage or current sources $41_1$, $41_2$ do not relate to two separate voltage or current sources $41_1$, $41_2$ but to a single, and in this case, to the first voltage or current source. In this context, this first voltage or current source according to FIG. 4 comprises a first digital/analog converter $53_1$. This first digital/analog converter $53_1$ is accordingly connected to the differential amplifier 50. For this purpose, the first digital/analog converter $53_1$ provides a first output $54_1$ and a second output $54_2$. The first output $54_1$ of the first digital/analog converter $53_1$ is accordingly connected to the first input $51_1$ of the differential amplifier 50. The second output $54_2$ of the first digital/analog converter $53_1$ is connected to the second input $51_2$ of the differential amplifier 50.

The first output $52_1$ of the differential amplifier 50 is connected to the second amplifier input $36_2$ of the first amplifier 35. The first output $52_1$ of the differential amplifier 50 is an inverted output. The second output $52_2$ of the differential amplifier 50 is connected to the first amplifier input $36_1$ of the first amplifier 35. The first output $52_1$ of the differential amplifier 50 is fed back via a fifth resistor $55_1$ to the first input $51_1$ of the differential amplifier 50. The second output $52_2$ of the differential amplifier 50 is fed back via a sixth resistor $55_2$ to the second input $51_2$ of the differential amplifier 50. Between the first output $54_1$ of the first digital/analog converter $53_1$ and the feedback, respectively the first input $51_1$ of the differential amplifier 50, a seventh resistor $55_3$ is further arranged. Between the second output $54_2$ of the first digital/analog converter $53_1$ and the feedback, respectively the second input $51_2$ of the differential amplifier 50, an eighth resistor $55_4$ is further arranged. Via the resistors $55_1$, $55_2$, $55_3$, $55_4$, the amplification of the differential amplifier 50 can, for example, be adjusted.

Via the first digital/analog converter $53_1$, the differential offset signal can be generated and output. For the case that the first digital/analog converter $53_1$ outputs an error voltage, for example, of 1 V, the voltage at the first output $52_1$ of the differential amplifier 50 to ground amounts to −0.5 V, whereas, the voltage at the second output $52_2$ of the differential amplifier 50 to ground is, for example, 0.5 V. In total, a differential voltage of 1 V is present between the first output $52_1$ and the second output $52_2$ of the differential amplifier 50 in this example.

The voltage or current source $41_3$ from FIG. 3 relates to a second voltage or current source which comprises a second digital/analog converter $53_2$. The second digital/analog converter $53_2$ is connected to a third input $51_3$ of the differential amplifier 50. The third input $51_3$ of the differential amplifier 50 is the common-mode terminal $51_3$. The second digital/analog converter $53_2$ is preferably connected via a diode 56 to the third input $51_3$ of the differential amplifier 50. In this context, an output of the second digital/analog converter $53_2$ is connected to an anode of the diode 56, whereas a cathode of the diode 56 is connected to the third input $51_3$ of the differential amplifier 50, that is, to the common-mode terminal $51_3$.

If a voltage of, for example, 1 V is output via this second digital/analog converter $53_2$, and if the voltage of the first digital/analog converter $53_1$ is also, for example, 1 V, then the voltage at the first output $52_1$ of the differential amplifier 30 increases from −0.5 V to +0.5 V. The voltage at the second output $52_2$ of the differential amplifier 50 also increases from +0.5 V to +1.5 V. The second digital/analog converter $53_2$ therefore generates the common-mode offset signal. The differential offset signal and the common-mode offset signal are supplied via the outputs $52_1$, $52_2$ of the differential amplifier 50 to the input signals $32_1$, $32_2$ and superposed on the latter. The second output $54_2$ of the first digital/analog converter $53_1$ is preferably connected to the reference ground.

The first input $34_1$ of differential probe 1 is connected via a resistor $57_1$ to the first amplifier input $36_1$. The second input $34_2$ of the differential probe 1 is connected via a resistor $57_2$ to the second amplifier input $36_2$. The first output $52_1$ of the differential amplifier 50 is connected via a resistor $57_3$ to the second amplifier input $36_2$. The second output $52_2$ of the differential amplifier 50 is connected via a resistor $57_4$ to the first amplifier input $36_1$. The differential amplifier 50 further provides a further correction unit 60 which compensates a drift in the common-mode offset signal. Such a drift can arise, for example, through aging or temperature-determined changes.

Figure 5:
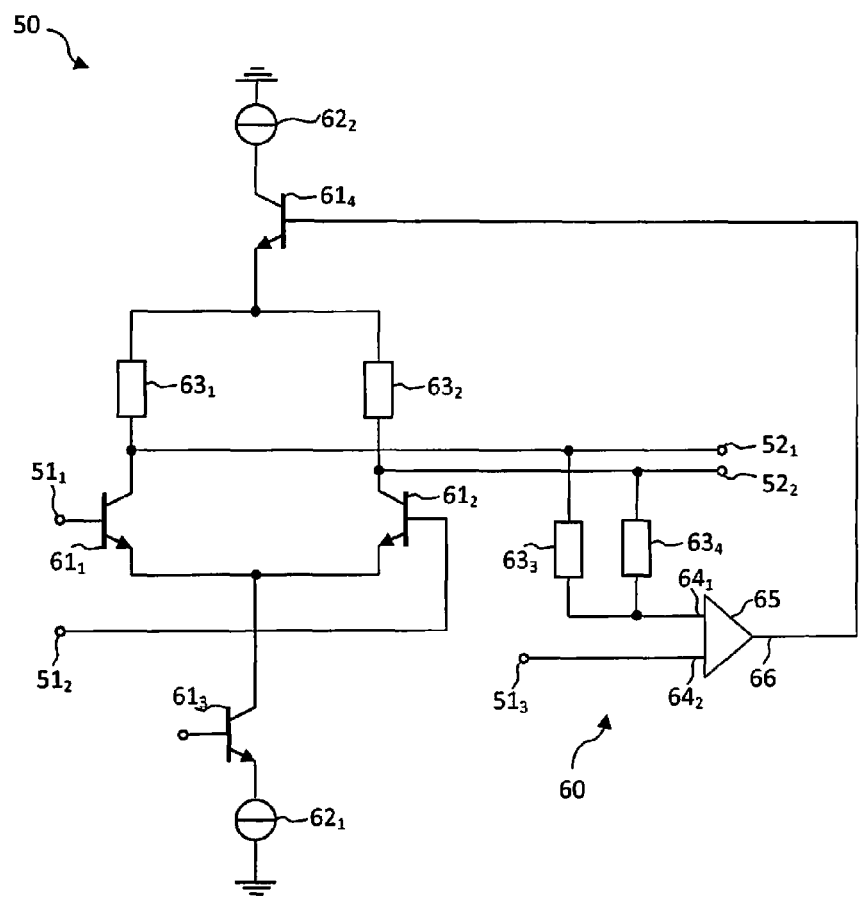
FIG. 5 an exemplary embodiment which shows the construction of a differential amplifier according to the invention with a correction unit for the common-mode offset signal.

FIG. 5 shows an exemplary embodiment for the construction of a differential amplifier 50 according to the invention with such a correction unit 60 for the common-mode offset signal. Accordingly, the first input $51_1$ of the differential amplifier 50 is connected to a base terminal of a first transistor $61_1$. The second input $51_2$ of the differential amplifier 50 is connected to a base terminal of a second transistor $61_2$. In this context, an emitter terminal of the first transistor $61_1$ is connected to an emitter terminal of the second transistor $61_2$. Both emitter terminals of the first and second transistors $61_1$, $61_2$ are connected to an output of a constant current source or of a first constant voltage source $62_1$. The output of this first constant current source $62_1$ or constant voltage source $62_1$ can also be optionally connected to an emitter terminal of a third transistor $61_3$, whereas a collector terminal of the third transistor $61_3$ is connected to the two emitter terminals of the transistors $61_1$ and $61_2$. Via a base voltage which is applied to the third transistor $61_3$ the current intensity can be regulated.

Furthermore, a collector terminal of the first transistor $61_3$ is connected via a ninth resistor $63_1$ to an emitter terminal of a fourth transistor $61_4$. Furthermore, a collector terminal of the second transistor $61_2$ is connected via a tenth resistor $63_2$ to the emitter terminal of the fourth transistor $61_4$. The collector terminal of the first transistor $61_1$ is furthermore connected to the first output $52_1$ of the differential amplifier 50. The collector terminal of the second transistor $61_2$ is connected to the second output $52_2$ of the differential amplifier 50.

Furthermore, the correction unit 60 for the correction of the drift of the common-mode offset signal is described. For this purpose, the collector terminal of the first transistor $61_1$ is connected via an eleventh resistor $63_3$ to a first input $64_1$ of a second amplifier 65. The collector terminal of the second transistor $61_2$ is connected via a twelfth resistor $63_4$ to the first input $64_1$ of the second amplifier 65. In this context, a second input $64_2$ of the second amplifier 65 is connected to the third input $51_3$, that is, the common-mode terminal $51_3$ of the differential amplifier 50. A first output 66 of the second amplifier 65 is connected to a base terminal of the fourth transistor $61_4$. A collector terminal of the fourth transistor $61_4$ is connected in turn to a second constant current source $62_2$ or voltage source $62_2$.

By preference, the ninth resistor $63_1$ and the tenth resistor $63_2$ provide an equally large resistance value. The eleventh resistor $63_3$ and the twelfth resistor $63_4$ must also provide an equally large resistance value. This is necessary, because the common-mode voltage is defined as half of a sum which is composed of the first and second output voltage. The first output voltage is present at the first output $52_1$, whereas the second output voltage is present at the second output $52_2$. These voltages are in principle added at the first input $64_1$ of the first amplifier 65. However, because of the fact that a voltage splitter comprising the eleventh resistor $63_3$ and the twelfth resistor $63_4$ is used, whereas the resistance values provide the same value, only half of the voltages of the first output $52_1$ and of the second output $52_2$ is present at the first input $64_1$ of the second amplifier 65.

This voltage, that is, the so-called actual common-mode signal is compared with the set common-mode signal, which is supplied via the third terminal $51_3$ of the differential amplifier 50 from the second digital/analog converter $53_2$. If the two signals are not equally large, the second amplifier 65 outputs an error signal at its output, which is supplied to the base of the fourth transistor $61_4$. Dependent upon whether the common-mode signal output at the outputs $52_1$, $52_2$ is larger than the set-value specification for the common-mode signal, the voltage at the collector terminals of the first and second transistors $61_1$, $61_2$ is accordingly increased or reduced. The difference between the common mode signal specified at the third terminal $51_3$ and that which is output is accordingly regulated away.

By preference, the differential probe 1 further provides a measuring prod which is not illustrated. In this context, the measuring prod is embodied to contact a first and a second input signal $32_1$, $32_2$ on a printed circuit board, which is not illustrated, whereas, in this context, the first amplifier 35 and the compensation device 40 are integrated directly in the measuring prod. This ensures that noise signals of the actual test signal are not superposed, thereby allowing very accurate measurement.

Within the description, the wording "connection" should be understood to the effect that this always relates to an electrical connection, unless otherwise specified. Within the scope of the invention, all of the features claimed and/or described and/or illustrated can be combined with one another arbitrarily. It will be obvious to those having skill in the art that many changes may be made to the details of the above-described embodiments of this invention without departing from the underlying principles thereof.

What is claimed is:
1. A differential probe comprising:
   a probe input which includes two probe inputs for recording a first input signal and a second input signal;
   a first amplifier; and
   a compensation device which generates and superposes on the first input signal and the second input signal a differential offset signal, wherein the compensation device also generates a common-mode offset signal, which is independent of the differential offset signal,
   wherein the compensation device includes no more than two voltage or current sources and a differential amplifier,
   wherein the differential amplifier includes a first input, a second input, a first output, and a second output,
   wherein a first voltage or current source includes a first digital/analog converter connected to the differential amplifier,
   wherein the first digital/analog converter includes a first output connected to a first input of the differential amplifier and a second output connected to a second input of the differential amplifier, and
   wherein the second output of the differential amplifier is connected to a first amplifier input and the first output of the differential amplifier is connected to a second amplifier input of the first amplifier.

2. The differential probe according to claim 1, wherein the compensation device superposes the common-mode offset signal on the first and the second input signal, and/or
   wherein the common-mode offset signal relates to a common-mode offset voltage or a common-mode offset current, and/or
   wherein the differential offset signal relates to a differential offset voltage or a differential offset current.

3. The differential probe according to claim 2, wherein the common-mode offset signal and/or the differential offset signal is supplied to the first and second input signal at the input of the differential probe, and/or
   wherein the common-mode offset signal and/or the differential offset signal is supplied to the first and second input signal at a low end in each case of a corresponding voltage splitter within the differential probe, and/or
   wherein the common-mode offset signal and/or the differential offset signal is supplied to a first and second input signal at a first and second amplifier input of the first amplifier of the differential probe, and/or
   wherein the common-mode offset signal and/or the differential offset signal is supplied to the first input signal in one of several stages of the first amplifier of the differential probe.

4. The differential probe according to claim 1, wherein the first amplifier provides a first amplifier input, wherein the first amplifier input is connected to the first input of the differential probe, wherein the first amplifier provides a second amplifier input, and wherein the second amplifier input is connected to a second input of the differential probe, and/or
   wherein the compensation device is connected to the first amplifier at its first amplifier input and/or at its second amplifier input.

5. The differential probe according to claim 4, wherein the differential probe provides a configured embodied to contact a printed circuit board to obtain a first input signal and a second input signal, and
   wherein the first amplifier and the compensation device are integrated in the test prod.

6. The differential probe according to claim 1, wherein a second voltage or current source includes a second digital/analog converter connected to a common-mode terminal of the differential amplifier.

7. The differential probe according to claim 6, wherein the second digital/analog converter is connected to an anode of a diode, and
   wherein a cathode of the diode is connected to the common-mode terminal of the differential amplifier.

8. The differential probe according to claim 6, wherein the differential amplifier provides a correction unit, which compensates a drift in the common-mode offset signal.

9. The differential probe according to claim 1, wherein the first input of the differential amplifier is connected to a base terminal of a first transistor, and/or
   wherein the second input of the differential amplifier is connected to a base terminal of a second transistor, and/or
   wherein an emitter terminal of the first transistor is connected to an emitter terminal of the second transistor, and wherein both emitter terminals are connected to an output of a first constant current source or voltage source, and/or
   wherein a collector terminal of the first transistor is connected via a ninth resistor to an emitter terminal of a fourth transistor, and wherein a collector terminal of the second transistor is connected via a tenth resistor to the emitter terminal of the fourth transistor, and/or
   wherein the collector terminal of the first transistor is connected to the first output of the differential amplifier, and wherein the collector terminal of the second transistor is connected to the second output of the differential amplifier.

10. The differential probe according to claim 9, wherein the collector terminal of the first transistor is connected via an eleventh resistor to a first input of a second amplifier, and wherein the collector terminal of the second transistor is connected via a twelfth resistor to the first input of the second amplifier, and/or
    wherein a second input of the second amplifier is connected to a common-mode terminal of the differential amplifier, and/or
    wherein a first output of the second amplifier is connected to a base terminal of the fourth transistor, and/or
    wherein a collector terminal of the fourth transistor is connected to a second constant current source or voltage source.

11. The differential probe according to claim 10, wherein the ninth resistor and the tenth resistor provide an equally large resistance value, and/or
    wherein the eleventh resistor and the twelfth resistor provide an equally large resistance value.

* * * * *